United States Patent
Ando et al.

(10) Patent No.: US 8,564,293 B2
(45) Date of Patent: Oct. 22, 2013

(54) METHOD FOR CHANGING SPIN RELAXATION, METHOD FOR DETECTING SPIN CURRENT AND SPINTRONICS DEVICE USING SPIN RELAXATION

(75) Inventors: Kazuya Ando, Kanagawa (JP); Kazuya Harii, Kanagawa (JP); Kohei Sasage, Kanagawa (JP); Eiji Saitoh, Kanagawa (JP)

(73) Assignee: Tohoku University, Sendai-shi, Miyagi (JP)

( * ) Notice: Subject to any disclaimer, the term of this patent is extended or adjusted under 35 U.S.C. 154(b) by 691 days.

(21) Appl. No.: 12/531,594

(22) PCT Filed: Mar. 14, 2008

(86) PCT No.: PCT/JP2008/054733
§ 371 (c)(1),
(2), (4) Date: Sep. 16, 2009

(87) PCT Pub. No.: WO2008/123023
PCT Pub. Date: Oct. 16, 2008

(65) Prior Publication Data
US 2010/0097063 A1    Apr. 22, 2010

(30) Foreign Application Priority Data

Mar. 16, 2007 (JP) .................. 2007-068371
Oct. 31, 2007 (JP) .................. 2007-283363

(51) Int. Cl.
*G01V 3/00* (2006.01)
(52) U.S. Cl.
USPC ......................... 324/316; 324/300

(58) Field of Classification Search
USPC ............................ 324/300–322; 600/407–445
See application file for complete search history.

(56) References Cited

U.S. PATENT DOCUMENTS

| | | | |
|---|---|---|---|
| 6,603,677 B2* | 8/2003 | Redon et al. ................... | 365/158 |
| 6,888,208 B2* | 5/2005 | Osipov et al. ................. | 257/421 |
| 7,061,797 B1* | 6/2006 | Miltat et al. ................... | 365/171 |
| 7,135,697 B2* | 11/2006 | Friesen et al. .................. | 257/14 |
| 7,219,018 B2* | 5/2007 | Vitaliano et al. ................ | 702/19 |
| 7,252,852 B1* | 8/2007 | Parkin ........................... | 427/131 |
| 7,309,887 B2* | 12/2007 | Osipov et al. ................. | 257/295 |

(Continued)

FOREIGN PATENT DOCUMENTS

| | | |
|---|---|---|
| JP | 9-214016 A | 8/1997 |
| JP | 11-271412 A | 10/1999 |

(Continued)

OTHER PUBLICATIONS

Shuichi Murakami et al., "Dissipationless Quantum Spin Current at Room Temperature", Scientce, vol. 301, Sep. 5, 2003, pp. 1348-1351.

(Continued)

*Primary Examiner* — Brij Shrivastav
(74) *Attorney, Agent, or Firm* — Westerman, Hattori, Daniels & Adrian, LLP

(57) ABSTRACT

The invention relates to a method for changing spin relaxation, a method for detecting a spin current, and a spintronic device using spin relaxation, and spin relaxation is changed through injection of a spin current.

A spin current 4 is injected into a material 1 in a certain spin state, so that the spin relaxation time can be controlled.

15 Claims, 12 Drawing Sheets

(56) References Cited

U.S. PATENT DOCUMENTS

| | | | |
|---|---|---|---|
| 7,313,015 B2 * | 12/2007 | Bessho | 365/158 |
| 7,606,010 B2 * | 10/2009 | Parkin | 360/324.2 |
| 7,719,070 B2 * | 5/2010 | Hall et al. | 257/425 |
| 7,825,402 B2 * | 11/2010 | Butov | 257/24 |
| 8,064,246 B2 * | 11/2011 | Slonczewski | 365/158 |
| 8,254,163 B2 * | 8/2012 | Kajiwara et al. | 365/170 |
| 2010/0226167 A1 * | 9/2010 | Kajiyama | 365/158 |
| 2011/0073970 A1 * | 3/2011 | Kai et al. | 257/421 |
| 2011/0075476 A1 * | 3/2011 | Kajiwara et al. | 365/170 |

FOREIGN PATENT DOCUMENTS

| | | |
|---|---|---|
| JP | 2002-305337 A | 10/2002 |
| JP | 2004-102330 A | 4/2004 |
| JP | 2006-032570 A | 2/2006 |
| JP | 2007-059879 A | 3/2007 |

OTHER PUBLICATIONS

E. Saitoh et al.., "Conversion of spin current into charge current at room temperature: Inverse Spin-Hall Effect", Applied Physics Letters, vol. 88, May 5, 2006, pp. 182509-1-182509-3.
http://www/s-graphics/cp.jp/nanoelectronics/news/hpmolcom/2.htm.
International Search Report for PCT/JP2008/054733, mailing date of Sep. 2, 2008.

* cited by examiner

METHOD FOR CHANGING SPIN RELAXATION, METHOD FOR DETECTING SPIN CURRENT AND SPINTRONICS DEVICE USING SPIN RELAXATION

TECHNICAL FIELD

The present invention relates to a method for changing spin relaxation, a method for detecting a spin current, and a spintronic device using spin relaxation, and in particular, to a method for changing spin relaxation characterized by having a configuration for controlling the conventional spin relaxation time, which is material parameter, by injecting a spin current, a method for detecting a spin current and a spintronic device using spin relaxation.

BACKGROUND ART

In the current electronics field of semiconductor devices, the charge degree of freedom of electrons is used while electrons have the spin degree of freedom in addition to charge.

In recent years, spintronics using the spin degree of freedom have been drawing attention as the bearer of information technology in the next generation.

In spintronics, charge of electrons and the spin degree of freedom are used simultaneously so as to aim at gaining functions and properties which did not exist in the prior art.

As an initial device in spintronics, GMR (giant magneto-resistive) elements can be cited, and these use a phenomenon of change when affected by the difference in the direction of magnetization of a free layer and in the direction of magnetization of a pinned layer depending on the spin of electrons which are a carrier of a sense current that flows through the GMR element, that is to say, whether the spin is an up spin or a down spin.

In recent years, spin RAM's where the direction of magnetization in a free layer is controlled by adjusting the spins of electrons which are a carrier of a current when a current flows directly through a GMR element or a TMR (tunnel magnet-resistive) element in an MRAM (magneto-resistive random access memory) having GMR elements and TMR elements as memory cells instead of controlling the direction of magnetization in a free layer by adjusting the magnetic field generated when a current flows through a wire layer as in the prior art (see for example Patent Document 1 or Patent Document 2).

In addition, quantum computers can be cited as another mode of spintronics, and in quantum computers, quantum bits (Qubits) are provided using spins of atoms, ions or molecules (see for example Patent Document 3 of Non-patent Document 1).

Furthermore, information is conveyed by means of an electron current in current information processing apparatuses, and a current flow accompanies Joule heat.

When Joule heat is generated, there is a problem with high power consumption, because it increases as the integration of information processing units increases, and therefore, transmission of information using a spin current instead of an electron current has been investigated.

This uses the properties that an electron current of conductive electrons in a solid is a chronologically irreversible process, whereas a spin current is a reversible process with almost no dissipation of energy, and thus does not cause the power consumption to increase.

That is to say, the movement of conduction electrons is reversed when the time is reversed in the minus direction, while a spin current has a momentum of spins themselves and an angular momentum of spins, though it is generated through the movement of conduction electrons, and therefore, the momentum and the angular momentum of spins are both reversed and set off in the case where the time is reversed in the minus direction, and thus, there is no reversal as a whole, and it becomes a reversible process.

In spintronics, the concept of spin relaxation becomes very important.

In spin RAM's, for example, the relaxation time of the magnetic moment in a free layer, that is to say, the spin relaxation time of individual electrons included in the free layer determines the rate of write-in, and therefore, it is desirable for spin relaxation to be small, in order for write-in to be easy, while it is desirable for the spin relaxation to be large, in order for the rate of write-in to be high.

In addition, in quantum computers, spin relaxation determines the time for holding information, and thus, spin relaxation is important.

That is to say, it is assumed that in functioning quantum computers, the time for operation is shorter than the decoherence time of the system, that is to say, the spin relaxation time.

Thus, spin relaxation means damping of movement of spin or magnetic moment.

That is to say, the movement of spins or the magnetic moment is precession having the direction of the magnetic field as a rotational axis, and can be represented by the Landau-Lifshitz-Gilbert (LLG) equation shown below, where an attenuating term is added to the basic equation for a magnetic moment.

$$d^V M/dt = -\gamma\, {}^V M \times H_{eff} + (\alpha/M_a)\, {}^V M \times (d^V M/dt)$$

Here, $M_a$ is the saturation magnetization, $H_{eff}$ is an effective magnetic field and $\alpha$ is Gilbert's relaxation constant.

In addition, "$^V M$" and "$^V H$" are used as vector symbols for the convenience of preparation of the specification.

The second term on the right side of this LLG equation is the damping, and represents the dissipation in the angular momentum and the energy of the spins or the magnetic moment, and the generation of a spin current, and the dissipation of the spin current makes it so that the spin or the magnetic moment is aligned in the direction of the external magnetic field $^V H$ after a predetermined relaxation time, and this phenomenon of generation of a spin current is known as spin pumping.

In addition, the spin-Hall effect is known to be a phenomenon relating to the effects of spins, and when a current flows through a sample, a pure spin current is generated without an accompanying current of charge in the direction perpendicular to the direction of the current, and thus, spin polarization is induced at the ends of the sample in the direction of the spin current (see for example Non-Patent Document 2).

In addition, the present inventor discovered that a current flows in the direction perpendicular to the direction of the pure spin current when a pure spin current is injected into a sample, and there is a difference in potential between the ends of the sample when the inverse spin-Hall effect is used, and thus, it becomes possible to detect whether or not there is a flow of a pure spin current by detecting the difference in potential (see for example Non-Patent Document 3).

Patent Document 1: Japanese Unexamined Patent Publication 2002-305337
Patent Document 2: Japanese Unexamined Patent Publication 2007-059879
Patent Document 3: Japanese Unexamined Patent Publication 2004-102330

Non-Patent Document 1:
http://www.s-graphics.co.jp/nanoelectronics/news/hpmol-com/2.htm Non-Patent Document 2: Science, Vol. 301, pp. 1348, 2003

Non-Patent Document 3: Applied Physics Letters, Vol. 88, p. 182509, 2006

DISCLOSURE OF THE INVENTION

Problem to Be Solved by the Invention

In conventional spintronics, however, there are no means for controlling or changing the spin relaxation time, even though the spin relaxation time is very important, and a problem arises, such that the spin relaxation time is determined by the spin relaxation time particular to individual materials.

In conventional spin RAM's for example, the rate of reversal of magnetization, which determines the rate of write-in, as described above, is dominated by spin relaxation, and therefore, it is desirable for spin relaxation to be small in the early period of write-in, while it is desirable for spin relaxation to be great in the late period of write-in. However, the spin relaxation time is determined by the material of the free layer, and therefore, write-in becomes difficult, though the rate of write-in becomes higher in the case where a material having great spin relaxation is selected. Meanwhile, though write-in becomes easy, a problem arises, such that the rate of write-in is low in the case where a material having small spin relaxation is selected.

In addition, quantum computers have a problem, such that there are no means for extending the decoherence time, which defines the upper limit for the operation time, which has become a bottleneck for implementing quantum computers.

Furthermore, in the case where the spin current is used as an information transmitting medium, a means for detecting the spin flow is necessary, and currently there are no appropriate means or configurations for detecting the spin current in a simple, microscopic structure.

Accordingly, an object of the present invention is to change spin relaxation by injecting a spin current, and at the same time increase the efficiency of pure spin injection.

Means for Solving Problem

Here, the means for solving the problem of the present invention are described in reference to FIG. 1.

FIG. 1

In order to solve the above described problem, the present invention provides a method for changing spin relaxation, and the spin relaxation time is controlled by injecting a spin current 4 into a certain material 1 in a particular spin state.

That is to say, the present invention is based on the new discovery that the spin relaxation time of a material 1 in a particular spin state can be controlled by injecting a spin current 4 using a phenomenon of generation of a spin current 4 together with dissipation of the angular momentum and energy of the spin or magnetic moment 2 during the above described spin relaxation process.

Thus, the spin current 4 makes control of the spin relaxation time possible, and as a result, increase in the speed, increase in the number of functions, and reduction in power consumption become possible in various types of spintronic devices and spintronics systems.

The spin relaxation time can be shortened by injecting the spin current 4 into the free layer that forms a magneto-resistive effect type random access memory (spin RAM) where the direction in which the free layer is magnetized is controlled through injection of a current, for example.

Alternatively, the spin relaxation time may be shortened by injecting the spin current 4 into the spin layer that forms a novel magneto-resistive effect type random access memory where the direction in which the free layer is magnetized is controlled through spin injection using the spin-Hall effect.

Alternatively, the spin relaxation time may be controlled by injecting the spin current 4 into the free layer that forms a magneto-resistive effect type random access memory (MRAM), where the direction in which the free layer is magnetized is controlled by an external magnetic field using the spin-Hall effect.

In addition, the spin relaxation time can be controlled by injecting the spin current 4 into a quantum bit that forms a solid-state quantum computer using the spin-Hall effect, and thus, the decoherence time required for the operation can be lengthened.

Alternatively, a method for changing spin relaxation according to which the spin current 4 is injected into a magnetic material where the magnetic moment 2 precedes using the spin-Hall effect may be used, so that microwaves in the vicinity of the ferromagnetic resonance frequency particular to a material are applied to the magnetic material, in order to detect change in the spin relaxation time, and thus, the spin current 4 can be detected.

As a result, a signal detection mechanism for cases where the spin current 4 is used as an information transmitting means can be built.

In this case, it is most realistic for a current 5 in a microwave band to flow through a microstrip line extending in the direction parallel to the direction in which the magnetic material is magnetized, in accordance with the method for applying microwaves.

In addition, spintronic devices may have a structure where a spin injection electrode 3 is provided so as to make contact with the free layer that forms a magneto-resistive effect type random access memory (MRAM) which controls the direction in which the free layer is magnetized by means of an external magnetic field.

Alternatively, a magneto-resistive effect type random access memory on the basis of a new principle may be formed by providing a spin injection electrode 3 so that it makes contact with the free layer that forms a magneto-resistive effect type random access memory where the direction in which the free layer is magnetized is controlled through spin injection.

Here, the spin injection electrode 3 for injecting a pure spin current 4 into the free layer may be formed of a material belonging to a region of a short mean free path, just before metal-insulator transition occurs, whether the direction in which the free layer is magnetized is controlled by means of an external magnetic field or it is controlled through pure spin injection.

Thus, the spin injection electrode 3 may be formed of a material of which the short mean free path is just before metal-insulator transition occurs, preferably of which the mean free path is 2 to 5 times longer than the average interatomic distance, so that the efficiency in conversion of a spin current can be increased. As a result, the injection efficiency of a pure spin current can be increased greatly, and thus, the device can be prevented from being destroyed by heat, and the power consumption can be lowered.

Here, the material is close to an insulator in the case where the mean free path is less than two times the average interatomic distance, while the material is close to polycrystal in the case where the mean free path exceeds five times the average interatomic distance, and the efficiency of conversion to a spin current lowers.

Alternatively, a structure where the spin injection electrode 3 for injecting a pure spin current into the free layer is an amorphous layer may be provided.

The material for forming the spin injection electrode 3 in a short mean free path region just before metal-insulator transition occurs may include a microscopic crystal material in the case where the crystallinity is low, but typically is an amorphous material.

It is desirable for the spin injection electrode 3 to be made of Pt, Au, Pd, or other elements having an f orbital.

The spin-Hall effect is strong when Pt, Au, other elements having an f orbital, or elements having strong spin orbit coupling, such as Pd, is used, and thus, the effects of injecting a pure spin current can be increased.

Alternatively, a microstrip line extending in the direction parallel to the longitudinal direction of the free layer may be provided in the vicinity of the free layer that forms the magneto-resistive effect type random access memory, and thus, ferroelectric resonance can be induced by a magnetic field generated when a current in a microwave band flows through the microstrip line.

Furthermore, a spin injection electrode 3 may be provided so as to make contact with quantum bits that form a solid-state quantum computer, and as a result, a spin current 4 is injected into a quantum bit, and thus, the decoherence time can be lengthened.

Here, it is desirable for the spin injection electrode 3 to be formed of Pt or Pd with strong spin orbit coupling.

Effects of the Invention

According to the present invention, ferromagnetic resonance can be induced by injecting a spin current, and the spin relaxing time can be controlled in a state of ferromagnetic resonance, and therefore, it becomes possible to construct a spintronic device and spintronics system having a novel configuration.

In particular, the principle of the present invention can be applied to magnetic memory apparatuses in order to shorten the spin relaxation time, and therefore, it is possible to implement a high-speed magnetic memory apparatus.

In addition, the configuration of the spin injection electrode is taken into consideration, so that a pure spin current can be injected into the free layer with high efficiency, and as a result, the amount of current that flows through the spin injection electrode in order to control the direction of magnetization and the spin relaxation time can be reduced, and therefore, reduction in power consumption and increase in the density become possible.

BEST MODE FOR CARRYING OUT THE INVENTION

According to the present invention, a spin current is injected into a material in a certain spin state so that the spin relaxation time can be controlled, and, for example, a spin current having a spin in such a direction as to accelerate spin relaxation is injected into a magnetic moment or spin in precession so that the spin relaxation time can be shortened, or a spin current having a spin in such a direction as to suppress spin relaxation is injected so that the spin relaxation time can be lengthened.

FIG. 2

Figure 1:
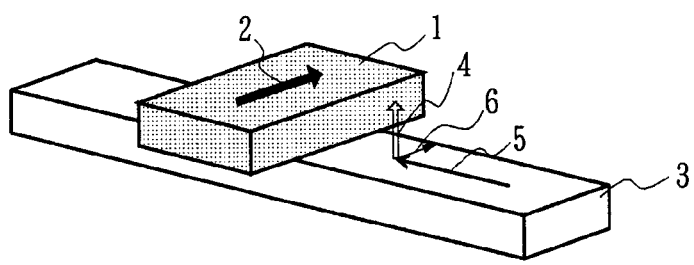
FIG. 1 is a diagram showing a configuration for illustrating the principle of the present invention.
Figure 2:
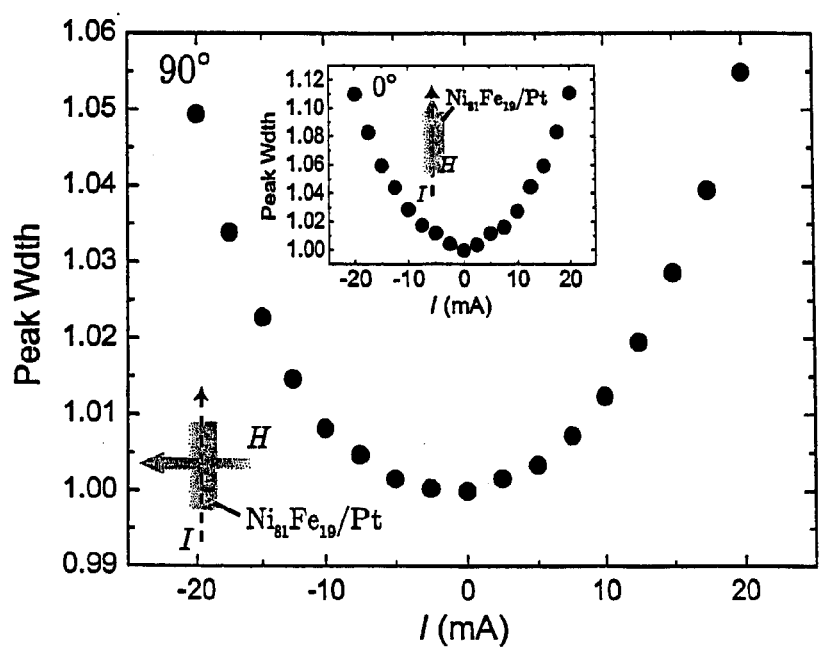
FIG. 2 is a graph for illustrating the dependency of the line width between peaks of ferromagnetic resonance FMR signals on the strength of the current.

The ferromagnetic resonance FMR is measured in the case where a current I flows through the Pt layer in such a state that a modulated magnetic field H having an intensity of 2 mT at 100 kHz is applied to a sample where an $Ni_{81}Fe_{19}$ layer having a thickness of 10 nm is deposited on top of the Pt layer having a thickness of 10 nm in a predetermined direction, and the peak width is plotted in FIG. 2, and thus, FIG. 2 shows a case where the direction of the current is perpendicular to the direction of the magnetic field (θ=90°), and the insertion shows a case where the direction of the current is parallel to the direction of the magnetic field (θ=0°).

As is clear from the figure, the line width between peaks of the FMR signals becomes wider as the current increases, and the line width between peaks corresponds to relaxation of the precession of the magnetization M, which is examined in further detail. Here, $Ni_{81}Fe_{19}$, which is a composition having no crystal magnetic anisotropy, is used as the magnetic material, in order to make the experiment easy.

FIG. 3

Figure 3:
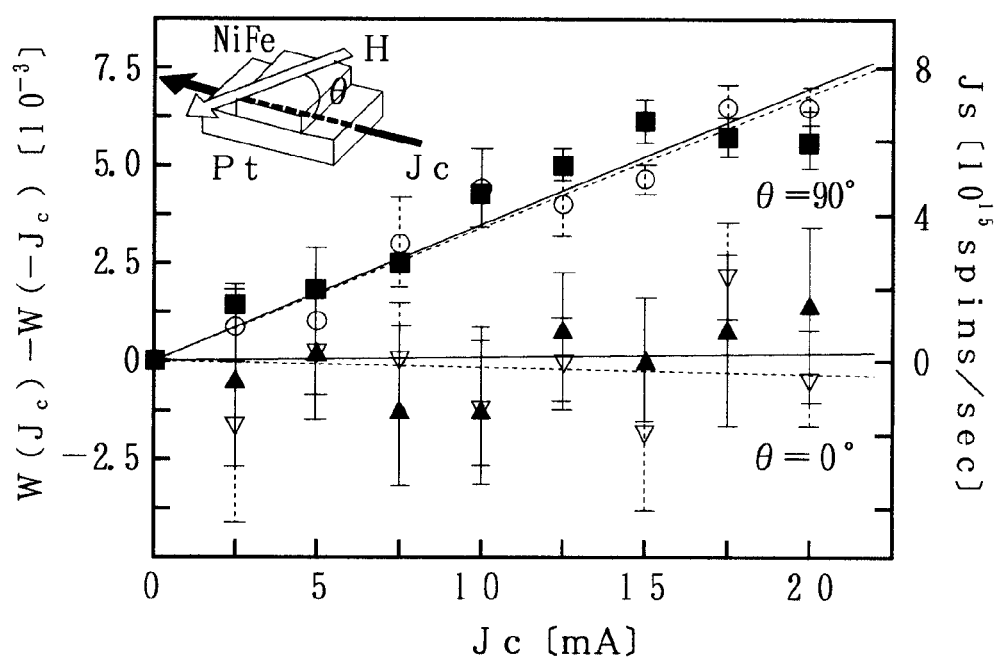
FIG. 3 is a graph for illustrating the dependency of the difference in the line width between peaks between currents in different directions on the absolute intensity of the current.

FIG. 3 is a graph for illustrating the dependency of the difference in the line width between peaks between currents in different directions on the absolute intensity of the current, and as shown in the figure, there is little difference between currents in different directions in the case where the direction of the current is parallel to the direction of the magnetic field ($\theta=0°$), and thus there is symmetry relative to the direction of the current.

Meanwhile, in the case where the direction of the current is perpendicular to the direction of the magnetic field ($\theta=90°$), there is asymmetry relative to the direction of the current.

This asymmetry is considered to be gained when a spin current is injected into the $Ni_{81}Fe_{19}$ layer from the Pt layer as a result of the spin-Hall effect so as to offset the spin current that flows out from the $Ni_{81}Fe_{19}$ layer as a spin pumping phenomenon in the case where the current is in one direction, and a spin current is injected into the $Ni_{81}Fe_{19}$ layer from the Pt layer as a result of the spin-Hall effect so as to increase the spin current that flows out from the $Ni_{81}Fe_{19}$ layer as a spin pumping phenomenon in the case where the current is in the other direction.

FIG. 4

Figure 4:
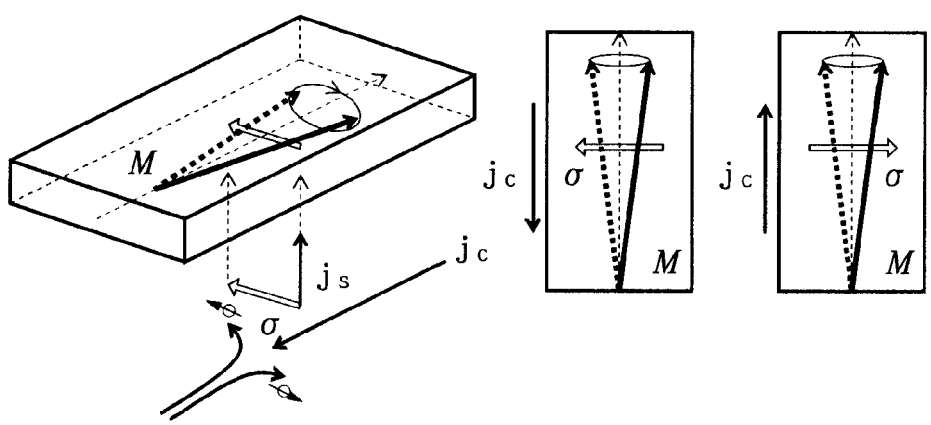
FIG. 4 is a diagram for illustrating the relationship between the magnetization M and the direction of the spin σ in the case where the direction of the current is parallel to the direction of the magnetic field.

FIG. 4 is a diagram for illustrating the relationship between the magnetization M and the direction of the spin σ in the case where the direction of the current is parallel to the direction of the magnetic field ($\theta=0°$), where the spin current $j_S$ is perpendicular to the current $j_C$, and at the same time, the direction of the spin σ is perpendicular to the spin current $j_S$ and the current $j_C$, while the direction of the spin σ is perpendicular to the direction of magnetization M.

The direction of magnetization M is in the direction of the magnetic field H as an average.

In this case, the relationship between the direction of the spin σ and the magnetization M does not change when the direction of the current $j_C$ is inverted, and therefore, it is shown that the FMR signal does not change even when the direction of the current $j_C$ is inverted, and this matches the result of symmetry in the case where the direction of the current in FIG. 3 is parallel to the direction of the magnetic field ($\theta=0°$) as in the above.

FIG. 5

Figure 5:
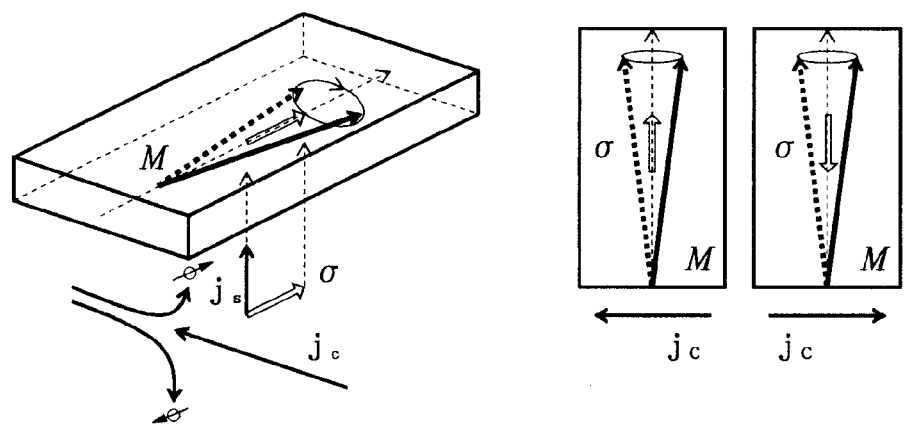
FIG. 5 is a diagram for illustrating the relationship between the magnetization M and the direction of the spin σ in the case where the direction of the current is perpendicular to the direction of the magnetic field.

FIG. 5 is a diagram for illustrating the relationship between the magnetization M and the direction of the spin σ in the case where the direction of the current is perpendicular to the direction of the magnetic field ($\theta=90°$), and in this case also, the spin current $j_S$ is perpendicular to the current $j_C$ and the direction σ of the spin is perpendicular to the spin current $j_S$ and the current $j_C$.

In this case, however, the direction of the spin σ is parallel to the magnetization M, and in the case where the direction of the current $j_C$ is inverted, the relationship is parallel and antiparallel.

At this time, the change in the FMR signal is considered to be dependent on the direction of the current $j_C$, and this matches the result of asymmetry in the case where the direction of the current in FIG. 3 is perpendicular to the direction of the magnetic field ($\theta=90°$) as in the above.

The asymmetry shows that the relaxation constant of the spin can be controlled by the direction of the spin σ, that is to say, the direction of the current, and accordingly, the spin friction of the magnetic moment can be controlled when the pure spin current generated in the Pt layer as a result of the spin-Hall effect is injected into the $Ni_{81}Fe_{19}$ layer.

The control of the relaxation constant of the spin as a result of the spin-Hall effect is practical particularly in magnetic memory devices, and at the beginning of write-in, a spin current having a spin in the direction for suppressing spin relaxation is injected so as to facilitate write-in. Meanwhile, at the end of write-in, a spin current having a spin in the direction opposite to the direction for accelerating spin relaxation is injected, so that the relaxation time is shortened, and thus, the write-in time can be shortened.

Here, the efficiency in the generation of a pure spin current resulting from the spin-Hall effect is low, and accordingly, in the case where applied to a spin RAM, the efficiency of injection of the spin current is low, and therefore, it is necessary for a large current to flow through the spin injection electrode.

Thus, the power consumption in the spin injection electrode becomes a problem and hinders increase in the integration.

Therefore, a pure spin current is injected into the free layer that forms the MRAM with high efficiency, so that the amount of current which flows when the direction of magnetization in the free layer is changed, the magnetic moment in precession is changed, or the spin relaxation time is shortened.

FIG. 6

Figure 6:
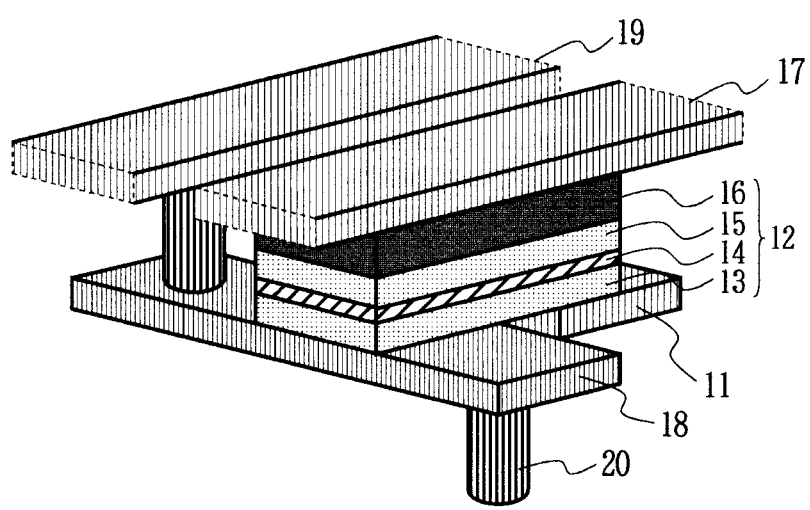
FIG. 6 is a schematic perspective diagram showing a magneto-resistive effect element that forms a memory cell of the spin RAM according to an embodiment of the present invention.

FIG. 6 is a schematic perspective diagram showing a magneto-resistive effect device that forms a memory cell in the spin RAM according to an embodiment of the present invention, where a TMR element 12 formed of a free layer 13, a tunnel insulating film 14 made of MgO or Al—O, a pinned layer 15 and an antiferromagnetic layer 16 is provided on a lower electrode 11, a bit line 17 is provided so as to make contact with the antiferromagnetic layer 16, a spin injection electrode 18 made of Pt or Au is provided so as to make contact with the free layer 13, and connection wires 19 and 20 are provided on this spin injection electrode 18.

In this case, the spin injection electrode 18 is provided so that the longitudinal direction is perpendicular to the longitudinal direction of the TMR element 12.

FIG. 7

Figure 7:
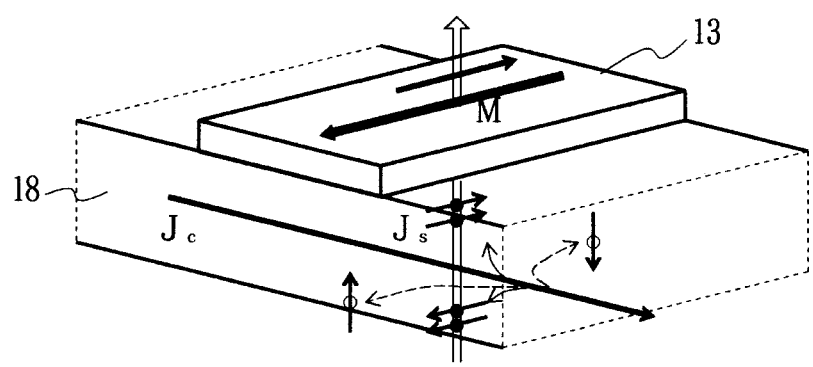
FIG. 7 is a diagram showing the principle of pure spin current injection.

FIG. 7 is a diagram for illustrating the principle of injection of a pure spin current. When a current $J_C$ flows through the spin injection electrode 18, a pure spin current $J_S$ which does not accompany a flow of charge in the direction perpendicular to the current $J_C$ is generated and injected into the free layer 13.

At this time, the direction of the spin $\sigma_S$ in the pure spin current $J_S$ is perpendicular to both the current $J_C$ and the pure spin current $J_S$, and the spin works to change the direction of magnetization M in the free layer 13.

In the embodiment of the present invention, the spin injection electrode 18 is formed of a material having an mean free path in such a short region as to be just before metal-insulator transition, preferably an mean free path two to five times the average distance between atoms, and typically formed of an amorphous material.

Here, the mean distance between atoms is evaluated using the density, and the average free path is evaluated using the residual resistance.

Thus, in order for the spin injection electrode 18 to be made of an amorphous material, the conductor film that forms the spin injection electrode 18 is formed with a sputtering method at room temperature (25° C.) with the temperature of the substrate at 50° C. or lower, and with a rate of film formation of 0.1 Å or more per minute, for example.

In addition, in the sputtering process for the spin injection electrode 18, Cu may be mixed in as an impurity, and the mean free path of electrons in the spin injection electrode 18 thus further shortened.

In the thus formed spin injection electrode, the efficiency of spin current conversion $\theta_{SHE}$ is measured to find the following:

amorphous Pt: $\theta_{SHE}$ ($\alpha$—Pt)~0.11 amorphous Au: $\theta_{SHE}$ ($\alpha$—Au)~0.132

Meanwhile, the efficiency of spin current conversion $\theta_{SHE}$ of polycrystal Pt and polycrystal Al is as follows:

polycrystal Pt: $\theta_{SHE}$ ($\alpha$—Pt)~0.0037 polycrystal Al: $\theta_{SHE}$ ($\alpha$—Al)~0.0001

The spin injection electrode is converted to be amorphous, so that the efficiency of spin current conversion can be successfully increased a great deal.

Here, the efficiency of spin current conversion $\theta_{SHE}$ can be found from the graph showing the dependency of the difference in the line width between peaks between currents in different directions on the absolute value of the current in FIG. 3, as in the above.

FIG. 3

$W(J_C)$ is the line width between peaks of the FMR (ferromagnetic resonance) signal in the case where a current $J_C$ flows through the spin injection electrode 18, and $W(-J_C)$ is the line width between peaks of the FMR (ferromagnetic resonance) signal in the case where a current $J_C$ flows through the spin injection electrode 18 in the direction opposite to that above.

$W(J_C)$ is proportional to the relaxation $\alpha_{SHE}$ when a spin is injected, and therefore, the change $\Delta\alpha_{SHE}$ in the relaxation $\alpha_{SHE}$ can be found from the curve $W(J_C)-W(-J_C)$.

When Y is the gyromagnetic ratio, $j_s^{SH}$ is the spin current density, $\omega$ is the angular frequency of the precession of the magnetization, $M_s$ is the saturation magnetization and $d_F$ is the film thickness of the ferromagnetic material, $\Delta\alpha_{SHE}$ can be represented by $$\Delta\alpha_{SHE}=yj_s^{SH}/(\omega M_s d_F) \quad (1)$$

Here, when $\eta$ is the efficiency of spin injection (efficiency for the converted spin current injected into the ferromagnetic material), h is the Planck constant, e is an elementary charge and $A_N$ is the cross-sectional area of spin injection electrode, the spin current density $j_s^{SH}$ can be represented by $$j_s^{SH}=\eta\theta_{SHE}[h/(2\Pi e)]\times J_C/A_N \quad (2)$$

Accordingly, when the change $\Delta\alpha_{SHE}$ of the relaxation $\alpha_{SHE}$ is found from the curve $W(J_C)-W(-J_C)$, the spin current density $j_s^{SH}$ can be found from the formula (1), and when the spin current density $j_s^{SH}$ is found, the efficiency in spin current conversion $\theta_{SHE}$ can be found from the formula (2), because the current $J_C$ that flows through the spin injection electrode 18 is already known.

Here, when $\sigma_{SHE}$ is the spin-Hall conductance of the spin current and $\sigma_C$ is the electrical conductance of electrons that flow through the ion injection electrode, the efficiency of spin current conversion $\theta_{SHE}$ is defined by $$\theta_{SHE}=\sigma_{SHE}/\sigma_C$$

This represents the efficiency for the current to be converted to the spin current in the spin injection electrode 18.

The increase in the efficiency of spin current conversion due to conversion to amorphous is considered to be because the mean free path of electrons is reduced as a result of conversion to amorphous, and the efficiency in spin orbit scattering, mainly the efficiency of skew scattering, increases.

As materials having high efficiency of spin current conversion, Pt, Au, other elements having an f orbit, and elements having strong spin orbit coupling, such as Pd, are appropriate.

In addition, other configurations include a signal detection mechanism in the case where a spin current is injected into a magnetic material where the magnetic moment in precession as a result of the spin-Hall effect, and the magnetic moment is disturbed so as to convert the state of precession, and in this state, microwaves of which the frequency is in the vicinity of the resonant frequency particular to the magnetic material are applied to the material so as to detect the reflection, and thus, whether or not the spin current is injected is detected, and the spin current is used as an information transmitting means.

Here, whether or not the spin current is injected can be detected in the configuration using the inverse spin-Hall effect, so that the difference in potential between the two ends of the magnetic material can be detected.

Example 1

Figure 8:
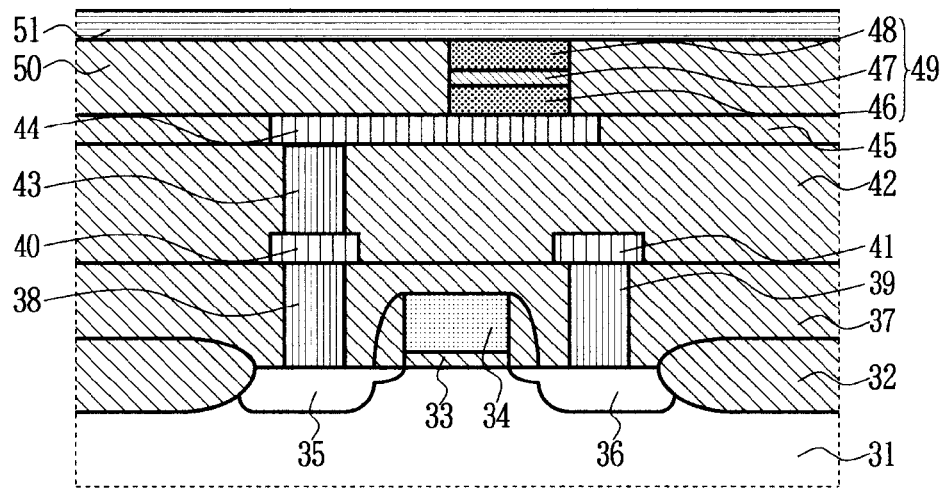
FIG. 8 is a conceptual cross sectional diagram showing a memory cell that forms an improved spin RAM according to Example 1 of the present invention.
Figure 9:
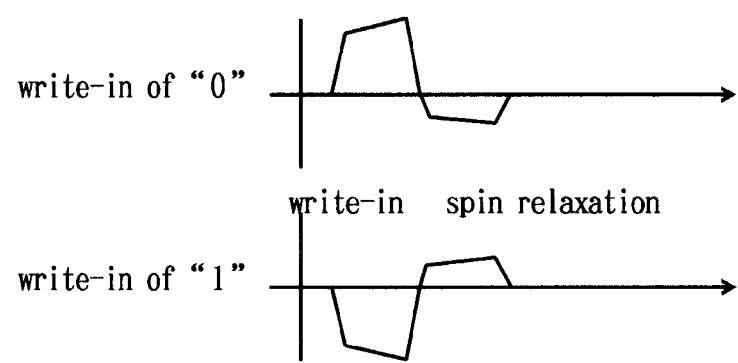
FIG. 9 is a graph for illustrating a method for writing into the improved spin RAM according to Example 1 of the present invention.

Here, the improved spin RAM according to Example 1 of the present invention is described in reference to FIGS. 8 and 9.

FIG. 8

FIG. 8 is a conceptual cross sectional diagram showing the memory cell that forms the improved spin RAM according to Example 1 of the present invention, and the structure itself is exactly the same as that of conventional spin RAM's.

As shown in the figure, a p type silicon substrate 31 is selectively oxidized so that an element isolation oxide film 32 is formed, and after that, a gate electrode made of WSi which is to become a word line 34 is formed in the element formation region with a gate insulating film 33 in between. Then, the gate electrode is used as a mask, and ions, such as of As, are implanted, so that an n+ type drain region 35 and an n+ type source region 36 are formed. Here, FIG. 8 shows a conceptual structure, and therefore, detailed explanations for structures which do not directly relate to the technical idea, such as side walls and extension regions, are omitted.

Next, a first interlayer insulating film 37 made of a TEOS (tetraethyl orthosilicate)-NSG film is formed, and after that, contact holes are created so as to reach the n+ type drain region 35 and the n+ type source region 36. Then, the contact holes are filled in with W, with Ti/TiN in between, so that W plugs 38 and 39 are formed.

Next, TiN/Al/TiN, for example, is deposited over the entire surface, followed by patterning, and thus, a connection conductor 40 and a ground line 41 connected to the n+ type source region 36 are formed.

Next, a thick, second interlayer insulating film 42, is formed of another TEOS-NSG film, and after that, a contact hole is created so as to reach the connection conductor 40, and this contact hole is filled in with W, with Ti/TiN in between, and thus, a W plug 43 is formed.

Next, TiN/Al/TiN is again deposited over the entire surface, followed by patterning, so that a lower electrode 44 is formed. Next, a thin, third interlayer insulating film 45, also made of a TEOS-NSG film, is deposited, and after that flattened through CMP (chemical mechanical polishing) until the lower electrode 34 is exposed.

Next, a free layer 46 having a three-layer structure where two magnetic material layers are isolated by a paramagnetic conductive layer, a tunnel insulating layer 47 made of Al2O3 with a thickness of 1 nm, for example, and a pinned layer 48 having a three-layer structure where two magnetic material layers are isolated by a paramagnetic conductive layer are deposited in sequence with a mask sputtering method, for example, and thus, a magnetic memory portion 49 is formed.

Next, a fourth interlayer insulating film 50 made of another TEOS-NSG film is deposited, and after that is planarized through CMP until the pinned layer 48 is exposed.

Next, a multilayer conductive layer having a TiN/Al/TiN structure is deposited over the entire surface, and after that patterned so as to extend in a direction perpendicular to the gate electrode that is to become a word line 34, so that a bit line 51 is formed, and thus, the basic structure of the improved spin RAM according to Example 1 of the present invention is completed.

FIG. 9

FIG. 9 is a diagram for illustrating a method for writing into the improved spin RAM according to Example 1 of the present invention. When information is written in, a write-in current flows in a first direction, for example from the pinned layer 48 side, so that "0" is written in, and after that, a weak current flows in the opposite direction from the free layer 46 side, so that spin relaxation accelerates before the precession of the magnetic moment in the free layer 46 converges.

Meanwhile, in the case where "1" is written in, a write-in current flows from the free layer 46 side, and after that, a weak current flows in the opposite direction from the pinned layer 48 side, so that spin relaxation accelerates before the precession of the magnetic moment in the free layer 46 converges.

Thus, a minuscule current flows at the end of write-in in such a direction as to accelerate spin relaxation when information is written into the spin RAM according to Example 1 of the present invention, and therefore, it becomes possible to make the write-in speed faster than in conventional spin RAM's.

Example 2

Figure 10:
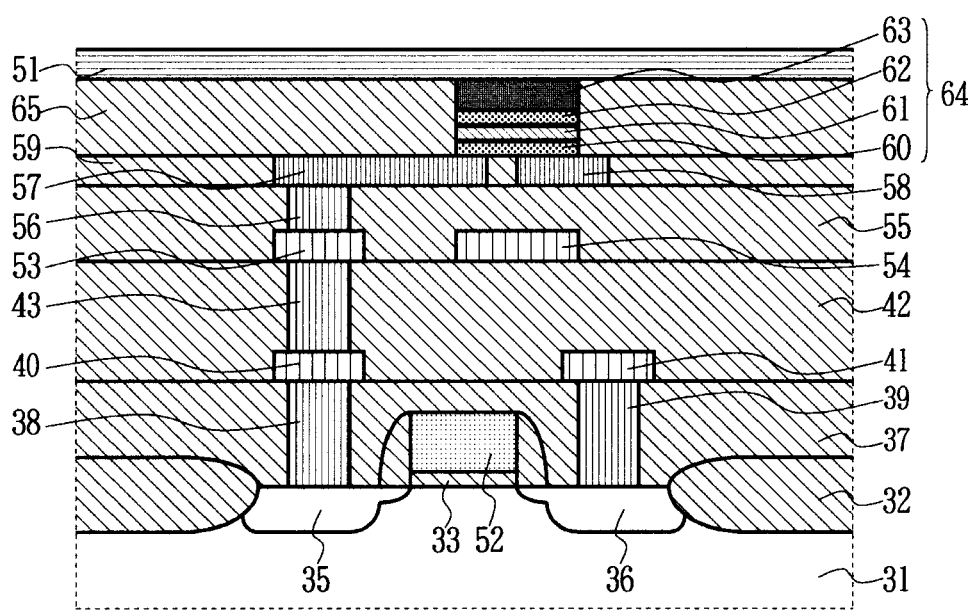
FIG. 10 is a conceptual cross sectional diagram showing a memory cell that forms a magnetic field write-in type MRAM according to Example 2 of the present invention.

Next, the magnetic field write-in type MRAM according to Example 2 of the present invention is described in reference to FIG. 10.

FIG. 10

FIG. 10 is a conceptual cross sectional diagram showing the memory cell that forms the magnetic field write-in type MRAM according to Example 2 of the present invention, and the structure itself is the same as that of conventional MRAM's with a spin injection electrode.

As shown in the figure, a p type silicon substrate 31 is selectively oxidized, as in the above Example 1, so that an element isolation oxide film 32 is formed, and after that, a gate electrode made of WSi which is to become a sense line 52 is formed in the element formation region with a gate insulating film 33 in between. Next, the gate electrode is used as a mask, and ions, such as of As, are implanted, so that an n+ type drain region 35 and an n+ type source region 36 are formed.

Next, a thick, first interlayer insulating film 37 is formed of a TEOS-NSG film, and after that, contact holes are created so as to reach the n+ type drain region 35 and the n+ type source region 36. Next, these contact holes are filled in with W, with Ti/TiN in between, and thus, W plugs 38 and 39 are formed.

Next, TiN/Al/Tin, for example, is deposited over the entire surface, followed by patterning, so that a connection conductor 40 and a ground line 41 connected to the n+ type source region 36 are formed.

Next, a thick, second interlayer insulating film 42 is formed of another TEOS-NSG film, and after that, a contact hole is created so as to reach the connection conductor 40, and this contact hole is filled in with W, with Ti/TiN in between, and thus, a W plug 43 is formed.

Next, TiN/Al/TiN is again deposited over the entire surface, followed by patterning, and thus, a word line 54 for write-in which is parallel to the connection conductive 53 and the sense line 52 is formed.

Next, a thick, third interlayer insulating film 55 made of another TEOS-NSG film is deposited, and after that, a contact hole is created so as to reach the connection conductor 53, and this contact hole is filled in with W with Ti/TiN in between, and thus, a W plug 56 is formed.

Next, Pt is deposited over the entire surface, followed by patterning, so that a lower electrode 57 and a spin injection electrode 58 which is parallel to the sense line 52 are formed. Next, a thin, fourth interlayer insulating film 59 made of another TEOS-NSG film is deposited, and after that is planarized through CMP until the lower electrode 57 is exposed.

Next, a free layer 60 made of NiFe having a thickness of 5 nm, for example, a tunnel insulating layer 61 made of Al2O3 having a thickness of 1 nm, for example, a pinned layer 62 made of CoFe having a thickness of 2 nm, for example, and an antiferromagnetic layer 63 made of IrMn having a thickness of 15 nm, for example, are deposited in sequence, so that a magnetic memory portion 64 is formed.

At this time, the magnetic memory portion 64 is formed so that the longitudinal direction is perpendicular to the direction in which the spin injection electrode 58 extends.

Next, a fifth interlayer insulating film 65 made of another TEOS-NSG film is deposited, and after that is planarized through CMP until the antiferromagnetic layer 63 is exposed.

Next, a multilayer conductive layer having a TiN/Al/TiN structure is deposited over the entire surface and after that patterned so as to extend in a direction perpendicular to the gate electrode which is to become a sense line 52, so that a bit line 51 is formed, and thus, the basic structure of the magnetic write-in type MRAM according to Example 2 of the present invention is completed.

In the case where information is written into the magnetic write-in type MRAM according to Example 2 of the present invention, a current flows through the word line 54 for write-in and the bit line 51, and thus, the synthetic magnetic field magnetically writes information into the free layer 60.

At this time, a minuscule current flows through the spin injection electrode 58 in such a direction as to lower spin relaxation at the beginning of write-in, so that a spin current is injected into the free layer 59, and information can be written in easily. Meanwhile, at the end of write-in, a weak current flows through the spin injection electrode 58 in the opposite direction, so that a spin current is injected in order to accelerate spin relaxation before the precession of the magnetic moment in the free layer 60 converges.

Thus, when information is written into the magnetic write-in type MRAM according to Example 2 of the present invention, a spin is injected in such a direction as to suppress spin relaxation at the beginning of write-in, and a spin is injected in such a direction as to accelerate spin relaxation at the end of write-in, and therefore, it becomes possible to make the write-in speed faster than in conventional MRAM's.

Example 3

Figure 11:
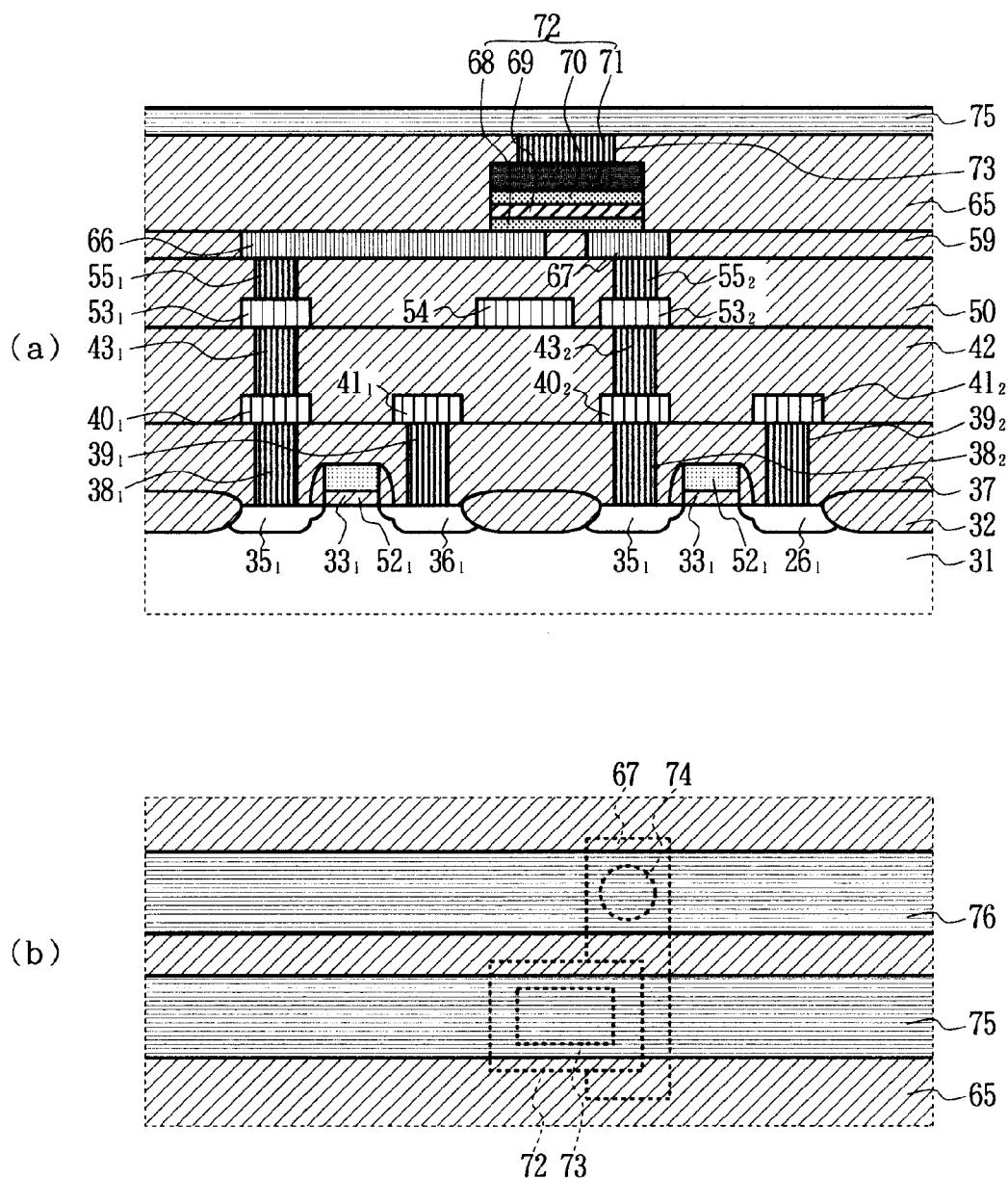
FIG. 11 is a schematic diagram showing the configuration of a memory cell that forms a magnetic field write-in type MRAM according to Example 3 of the present invention.

Next, the magnetic field write-in type MRAM according to Example 3 of the present invention is described in reference to FIG. 11, and Example 3 is gained by increasing the efficiency of pure spin injection in the magnetic field write-in type MRAM in the above Example 2.

FIGS. 11(a) and 11(b)

FIGS. 11(a) and 11(b) are schematic diagrams showing the configuration of the memory cell that forms the magnetic field write-in type MRAM according to Example 3 of the present invention, and the structure itself is the same as that of the MRAM in Example 1 with a word line for write-in.

Here, FIG. 11(a) is a schematic cross sectional diagram, and FIG. 11(b) is a schematic plan diagram showing the appearance of wires.

As shown in the figures, a p type silicon substrate 31 is selectively oxidized so that an element isolation oxide film 32 is formed, and after that, gate electrodes made of WSi which are to become a sense line $52_1$ and a wire for injection $52_2$ are formed in the element formation region, and these gate electrodes are used as a mask, and ions, such as of As, are implanted, so that n+ type drain regions $35_1$ and $35_2$, as well as n+ type source regions $36_1$ and $36_2$, are formed, and thus, a pair of MOSFET's are formed.

Next, a thick, first interlayer insulating film 37 is formed of a TEOS-NSG film, and after that, contact holes are created so as to reach the n+ type drain regions $35_1$ and $35_2$, as well as the n+ type source regions $36_1$ and $36_2$. Next, these contact holes are filled in with W, with Ti/TiN in between, so that W plugs $38_1$, $38_2$, $39_1$ and $39_2$ are formed.

Next, TiN/Al/TiN, for example, is deposited over the entire surface, followed by patterning, so that connection conductors $40_1$ and $40_2$, as well as ground lines $41_1$ and $41_2$ connected to the n+ type source regions $36_1$ and $36_2$ are formed. Next, a thick, second interlayer insulating film 42 is formed of another TEOS-NSG film, and after that, contact holes are created so as to reach the connection conductors $40_1$ and $40_2$, and these contact holes are filled in with W, with Ti/TiN in between, and thus, W plugs $43_1$ and $43_2$ are formed.

Next, TiN/Al/TiN is again deposited over the entire surface, followed by patterning, so that connection conductors $62_1$ and $62_2$ and a word line for write-in 54 that is parallel to the sense line $52_1$ are formed. Next, a thick, third interlayer insulating film 50 made of another TEOS-NSG film is deposited, and after that, contact holes are created so as to reach the connection conductors $62_1$ and $62_2$, and these contact holes are filled in with W, with Ti/TiN in between, and thus, W plugs $55_1$ and $55_2$ are formed.

Next, Pt is deposited over the entire surface, followed by patterning, so that a lower electrode 66 and a spin injection electrode 67 which is parallel to the sense line $52_1$ are formed so as to be connected to W plugs $55_1$ and $55_2$, respectively. Next, a thin, fourth interlayer insulating film 59 made of another TEOS-NSG film is deposited, and after that is planarized through CMP until the lower electrode 66 and the spin injection electrode 67 are exposed.

During the process for forming the spin injection electrode 67, the film is formed at room temperature (25° C.) with the temperature of the substrate at 50° C. or lower and the speed of film formation at 0.1 Å or more per minute, for example, in order to form the spin injection electrode 67 of amorphous Pt.

Next, a free layer 68 made of NiFe having a thickness of 5 nm, for example, a tunnel insulating layer 69 made of MgO having a thickness of 1 nm, for example, a pinned layer 70 made of CoFe having a thickness of 2 nm, for example, and an antiferromagnetic layer 71 made of IrMn having a thickness of 15 nm, for example, are deposited in sequence, so that a magnetic memory portion 72 is formed.

At this time, the magnetic memory portion 72 is formed so that the longitudinal direction is perpendicular to the direction in which the spin injection electrode 67 extends.

Next, a fifth interlayer insulating film 65 made of another TEOS-NSG film is deposited, and after that, recesses for connection extending to the antiferromagnetic layer 71 and the other end of the spin injection electrode 67 are created. Next, the recess is filled in with W, with Ti/TiN in between, so that a connection conductor 73 and a W plug 74 are formed.

Next, a multilayer conductive layer having a TiN/Al/TiN structure is deposited over the entire surface, followed by patterning, so as to extend in a direction perpendicular to the gate electrode which is to become a sense line $52_1$, so that a bit line 75 connected to the connection conductor 73 and a wire for injection 76 connected to the W plug 74 are formed, and thus, the basic structure of the magnetic field write-in type MRAM according to Example 3 of the present invention is completed.

In the case where information is written into the magnetic field write-in type MRAM according to Example 3 of the present invention, a current flows through the word line 54 for write-in and the bit line 75, and the synthetic magnetic field magnetically writes information into the free layer 68.

At this time, a minuscule current flows through the spin injection electrode 67 in such a direction as to reduce spin relaxation at the beginning of write-in, so that a spin current is injected into the free layer 68, and thus, information can be written in easily. Meanwhile, at the end of write-in, a weak current flows through the spin injection electrode 67 in the opposite direction, so that a spin current is injected in order to accelerate spin relaxation before the precession of the magnetic moment in the free layer 68 converges.

Thus, when information is written into the magnetic field write-in type MRAM according to Example 3 of the present invention, a pure spin current is injected in such a direction as to suppress spin relaxation at the beginning of write-in, while a pure spin current is injected in such as direction as to accelerate spin relaxation at the end of write-in, and the efficiency of injection of the pure spin current increases a great deal, and therefore, only a small amount of current flows through the spin injection electrode, and thus, it becomes possible to lower the power consumption.

Example 4

Figure 12:
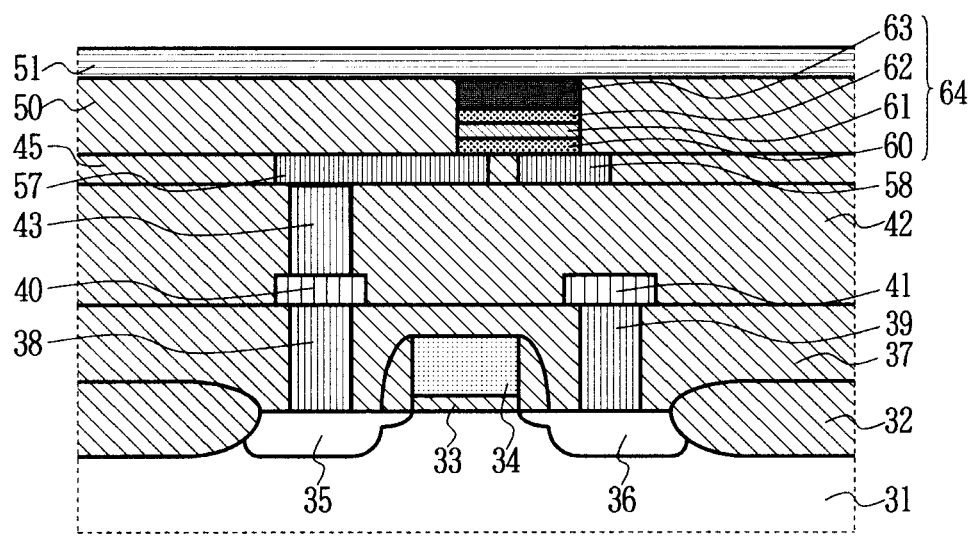
FIG. 12 is a conceptual cross sectional diagram showing a memory cell that forms a pure spin flow write-in type MRAM according to Example 4 of the present invention.

Here, the pure spin current write-in type MRAM according to Example 4 of the present invention is described in reference to FIG. 12.

FIG. 12

FIG. 12 is a conceptual cross sectional diagram showing the memory cell that forms the pure spin current write-in type MRAM according to Example 4 of the present invention, and the structure itself is the same as that of conventional MRAM's provided with a spin injection electrode instead of a word line for write-in.

As shown in the figure, a p type silicon substrate 31 is selectively oxidized, so that an element isolation oxide film 32 is formed in the same manner as in the above Example 1, and after that, a gate electrode made of WSi which is to become a word line 34 is formed in the element formation region with a gate insulating film 33 in between. Next, this gate electrode is used as a mask, and ions, such as of As, are implanted, so that an n+ type drain region 35 and an n+ type source region 36 are formed.

Next, a thick, first interlayer insulating film 37 is formed of a TEOS-NSG film, and after that, contact holes are created so as to reach the n+ type drain region 35 and the n+ type source region 36. Next, these contact holes are filled in with W, with Ti/TiN in between, so that W plugs 38 and 39 are formed.

Next, TiN/Al/TiN, for example, is deposited over the entire surface, followed by patterning, so that a connection conductor 40 and a grounding line 41 connected to the n+ type source region 36 are formed. Next, a thick, second interlayer insulating film 42 is formed of another TEOS-NSG film, and after that, a contact hole is created so as to extend to the connection conductor 40, and this contact hole is filled in with W, with Ti/TiN in between, and thus, a W plug 43 is formed.

Next, Pt is deposited over the entire surface, followed by patterning, so that a lower electrode 57 and a spin injection electrode 58 which is parallel to the word line 34 are formed. Next, a thin, third interlayer insulating film 45 made of another TEOS-NSG film is deposited, and after that is planarized through CMP until the lower electrode 57 is exposed.

Next, a free layer 60 made of NiFe having a thickness of 5 nm, for example, a tunnel insulating layer 61 made of Al2O3 having a thickness of 1 nm, for example, a pinned layer 62 made of CoFe having a thickness of 2 nm, for example, and an antiferromagnetic layer 63 made of IrMn having a thickness of 15 nm, for example, are deposited in sequence, so that a magnetic memory portion 64 is formed.

At this time, the magnetic memory portion 64 is formed so that the longitudinal direction is perpendicular to the direction in which the spin injection electrode 58 extends.

Next, a fourth interlayer insulating film 50 made of another TEOS-NSG film is deposited, and after that is planarized through CMP until the antiferromagnetic layer 63 is exposed.

Next, a multilayer conductive layer having a TiN/Al/TiN structure is deposited over the entire surface, and after that patterned so as to extend in a direction perpendicular to the gate electrode that is to become a word line 34 so that a bit line 51 is formed, and thus, the basic structure of the pure spin write-in type MRAM according to Example 4 of the present invention is completed.

In the case where information is written into the pure spin write-in type MRAM according to Example 4 of the present invention, a write-in current flows through the spin injection electrode 58 at the beginning of write-in so that a spin current is injected into the free layer 60, and thus, information is written in. Meanwhile, at the end of write-in, a weak current flows through the spin injection electrode 58 in the direction opposite to the write-in current so that a spin current is injected in order to accelerate spin relaxation before the precession of the magnetic moment in the free layer 60 converges.

Thus, information is written in through spin injection from the spin injection electrode 58 in Example 4 of the present invention, and therefore, the speed of write-in can be made higher than in conventional magnetic write-in type MRAM's, and at the same time, the configuration of the magnetic memory portion can be made simple in comparison with conventional spin RAM's.

Example 5

Figure 13:
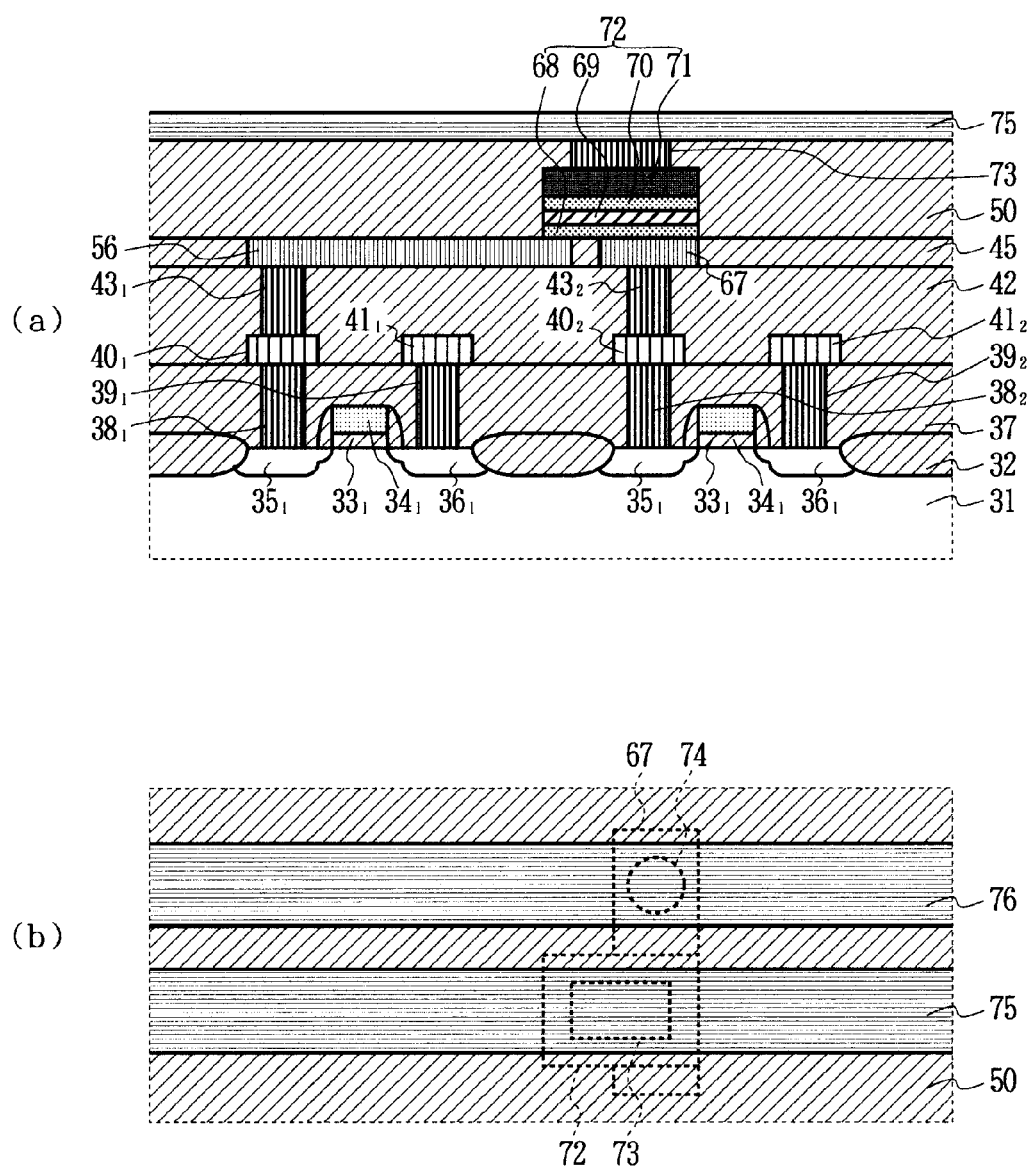
FIG. 13 is a conceptual diagram showing the configuration of a memory cell that forms a pure spin flow write-in type MRAM according to Example 5 of the present invention.
Figure 14:
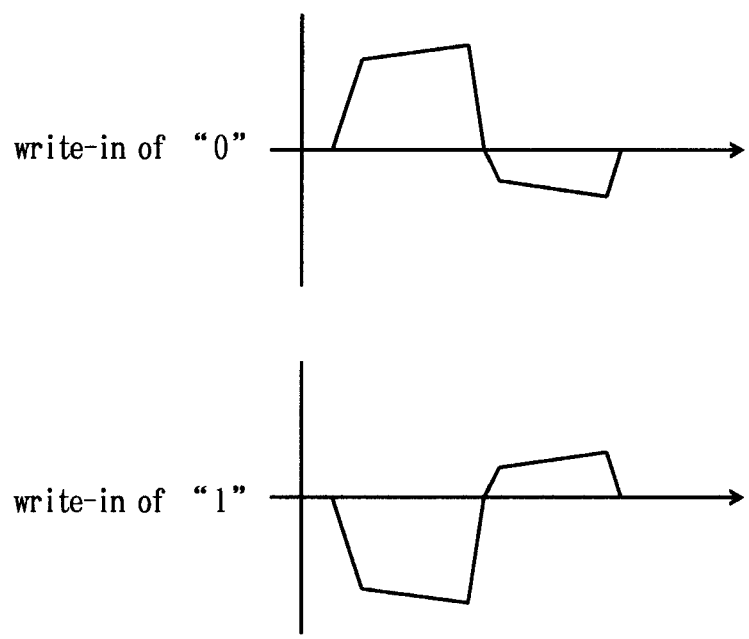
FIG. 14 is a graph for illustrating a method for writing into the pure spin current write-in type MRAM according to Example 5 of the present invention.

Next, the pure spin current write-in type MRAM according to Example 5 of the present invention is described in reference to FIGS. 13(a), 13(b) and 14. In this Example 5, the efficiency of pure spin injection is higher than in the above described pure spin current write-in type MRAM according to Example 4.

FIGS. 13(a) and 13(b)

FIGS. 13(a) and 13(b) are conceptual diagrams showing the structure of the memory cell that forms the pure spin current write-in type MRAM according to Example 5 of the present invention. FIG. 13(a) is a schematic cross sectional diagram, and FIG. 13(b) is a schematic plan diagram showing the appearance of wires.

As shown in the figures, a p type silicon substrate 31 is selectively oxidized so that an element isolation oxide film 32 is formed, and after that, gate electrodes made of WSi which are to become a word line $34_1$ and a wire for write-in $34_2$ are formed in the element formation region with gate insulating films $33_1$ and $33_2$ in between. These gate electrodes are used as a mask, and ions, such as of As, are implanted, so that n+ type drain regions $35_1$ and $35_2$, as well as n+ type source regions $36_1$ and $36_2$, are formed, and thus, a pair of MOS-FET's are formed.

Here, FIGS. 13(a) and 13(b) show a conceptual configuration, and therefore, no detailed explanation is given for the structure of the side walls and extension regions, which do not directly relate to the technical idea.

Next, a thick, first interlayer insulating film 37 is formed of a TEOS-NSG film, and after that, contact holes are created so as to extend to the n+ type drain regions $35_1$ and $35_2$, as well as the n+ type source regions $36_1$ and $36_2$. Next, these contact holes are filled in with W, with Ti/TiN in between, so that W plugs $38_1$, $38_2$, $39_1$ and $39_2$ are formed.

Next, TiN/Al/TiN, for example, is deposited over the entire surface, followed by patterning, and thus, ground lines $41_1$ and $41_2$ are formed so as to be connected to connection conductors $40_1$ and $40_2$, as well as the n+ type source regions $36_1$ and $36_2$. Next, a thick, second interlayer insulating film 42 is formed of another TEOS-NSG film, and after that, contact holes are created so as to extend to the connection conductors $40_1$ and $40_2$, and these contact holes are filled in with W, with Ti/Tin in between, so that W plugs $43_1$ and $43_2$ are formed.

Next, Pt is deposited over the entire surface, followed by patterning, so that a lower electrode 66 and a spin injection electrode 67 parallel to the word line $34_1$ are formed so as to be connected to the W plugs $43_1$ and $43_2$, respectively. Next, a thin, third interlayer insulating film 45 made of another TEOS-NSG film is deposited, and after that is planarized through CMP until the lower electrode 66 and the spin injection electrode 67 are exposed.

In the process for forming the spin injection electrode 67, a film is formed at room temperature (25° C.) with the temperature of the substrate at 50° C. or lower, at a speed of film formation of 0.1 Å or more per minute, for example, in order to form the spin injection electrode 67 of amorphous Pt, as described above.

Next, a free layer 68 made of NiFe having a thickness of 5 nm, for example, a tunnel insulating layer 69 made of MgO having a thickness of 1 nm, for example, a pinned layer 70 made of CoFe having a thickness of 2 nm, for example, and an antiferromagnetic layer 71 made of IrMn having a thickness of 15 nm, for example, are deposited in sequence, so that a magnetic memory portion 72 is formed.

At this time, the magnetic memory portion 72 is formed so that the longitudinal direction is perpendicular to the direction in which the spin injection electrode 67 extends.

Next, a fifth interlayer insulating film 50 made of another TEOS-NSG film is deposited, and after that, recesses for connection are created so as to extend to the antiferromagnetic layer 71 and the other end of the spin injection electrode 67. Next, these recesses are filled in with W, with Ti/TiN in between, so that a connection conductor 73 and a W plug 74 are formed.

Next, a multilayer conductive layer having a TiN/Al/TiN structure is deposited over the entire surface, and after that patterned so as to extend in the direction perpendicular to the gate electrode that is to become a sense line $52_1$, so that a bit line 75 connected to the connection conductor 73 and a wire for injection 76 connected to the W plug 74 are formed, and thus, the basic structure of the pure spin current write-in type MRAM according to Example 5 of the present invention is completed.

FIG. 14

FIG. 14 is a graph for illustrating a method for writing into the pure spin current write-in type MRAM according to Example 5 of the present invention, and in the case where information is written into the pure spin current write-in type MRAM according to Example 5 of the present invention, a write-in current flows through the spin injection electrode 67 at the beginning of write-in, so that a spin current is injected into the free layer 68, and thus information written in. Meanwhile, at the end of write-in, a weak current in the direction opposite to the write-in current flows through the spin injection electrode 67, so that a spin current is injected in order to accelerate spin relaxation before the precession of the magnetic moment in the free layer 68 converges.

That is to say, when information is written in, a write-in current flows in a first direction from the pinned layer 70 side, so that "0" is written in, and after that, a weak current flows in the opposite direction from the free layer 68 side so as to accelerate spin relaxation before the precession of the magnetic moment in the free layer 68 converges.

Meanwhile, in the case where "1" is written in, a write-in current flows from the free layer 68 side, and after that, a weak current flows in the opposite direction from the pinned layer 70 side so as to accelerate spin relaxation before the precession of the magnetic moment in the free layer 68 converges.

Thus, the spin injection electrode is formed of amorphous Pt in Example 5 of the present invention, and therefore, the efficiency of pure spin current conversion improves a great deal. As a result, the time for reversal of magnetization can be shortened, and the current required for write-in can be reduced a great deal, and thus, it becomes possible to reduce power consumption.

Example 6

Figure 15:
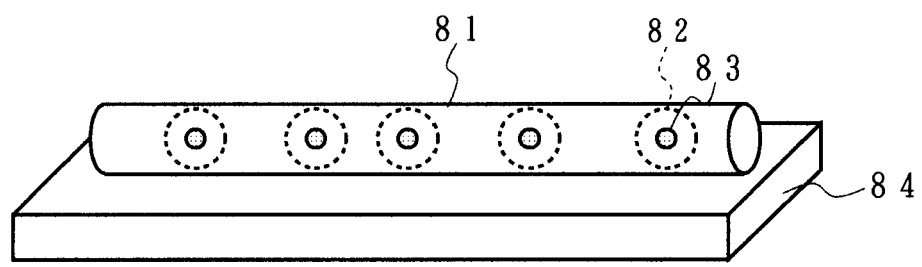
FIG. 15 is a conceptual diagram showing the configuration of a quantum operation apparatus according to Example 6 of the present invention.

Here, the quantum operation apparatus according to Example 6 of the present invention is described in reference to FIG. 15.

FIG. 15

FIG. 15 is a conceptual diagram showing the configuration of the quantum operation apparatus according to Example 6 of the present invention, which is gained by providing the quantum operation element in the above described Patent Document 3 with a spin injection electrode.

As shown in the figure, a carbon nanotube 81 containing a number of endohedral fullerenes 82 which encapsulate inclusion atoms 83 where the nuclear spin has a value other than zero, for example nitrogen ($^{14}$N) or phosphorous ($^{31}$P) is provided so as to make contact with a spin injection electrode 84 made of Pt.

In this case, the principle of quantum operation is the same as in the above Patent Document 3, and there is nuclear magnetic resonance in the inclusion atoms 83 when a magnetic field H is applied to the inclusion atoms 83 by means of a coil for applying a magnetic field, and at the same time, an alternating magnetic field is applied by means of an alternating magnetic field applying means, and as a result, there is a magnetic field in the inclusion atoms 83 when nuclear spins are aligned, and the current generated on the basis of this magnetic field is detected by a current detecting means, and thus, the quantum state can be differentiated depending on the direction of the nuclear spins in the inclusion atoms 83.

At this time, precession of nuclear spins in the inclusion atoms 83 can be maintained for a long time by injecting a spin current from the spin injection electrode 84, and as a result, the decoherence time can be lengthened, and it becomes easy to perform quantum operation.

Example 7

Figure 16:
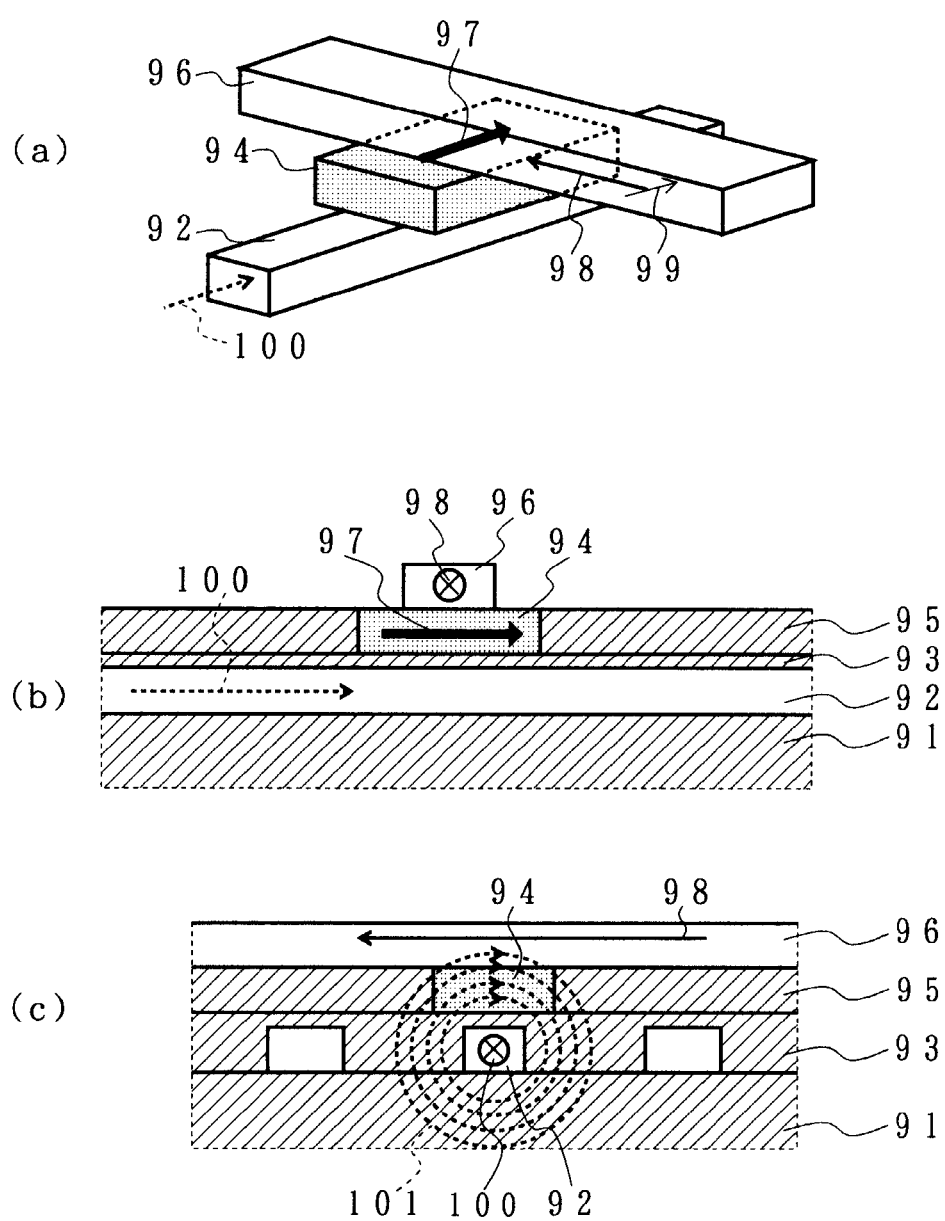
FIG. 16 is a conceptual diagram showing the configuration of a spin current detecting portion according to Example 7 of the present invention.

Here, the method for detecting a spin current according to Example 7 of the present invention is described in reference to FIGS. 16(*a*) to 16(*c*).

FIGS. 16(*a*) to 16(*c*)

FIGS. 16(*a*) to 16(*c*) are conceptual diagrams showing the configuration of the spin current detecting portion according to Example 7 of the present invention. FIG. 16(*a*) is a conceptual perspective diagram, FIG. 16(*b*) is a conceptual cross sectional diagram, and FIG. 16(*c*) is a diagram showing a state in which microwaves are applied.

As shown in the figures, a spin current detecting portion 94 made of a magnetic material, such as NiFe, is provided on top of a microstrip line 92 with an insulating film 93 in between, and at the same time, a spin current signal line 96 made of Al or Cu is provided so as to extend in the direction perpendicular to the longitudinal direction of the spin current detecting portion 94.

In this case, the direction in which the spin current detecting portion 94 is magnetized, that is to say, the orientation of the magnetic moment 97, is the longitudinal direction, due to the shape anisotropy.

At this time, microwaves 100 with a frequency is in the vicinity of the resonant frequency particular to the spin current detecting portion 94 are applied, that is to say, a current with a high frequency in the microwave band flows through the microstrip line 92, and as a result, a magnetic field 101 which vibrates in the microwave band generated by means of a current with high frequency is applied to the spin current detecting portion 94, and thus, the magnetic moment 97 in the spin current detecting portion 94 causes ferromagnetic resonance, which results in precession.

In the case where a signal, that is to say, a spin current 98, flows through the spin current signal line 96, the state of ferromagnetic resonance in the spin current detecting portion 94 changes under the effects of the spin current 98, so that the current that flows through the microstrip line 92 fluctuates, causing reflection, and therefore, it becomes possible to find out whether or not there is a spin current 98, by detecting the reflection.

Here, the symbol 99 in the figures is the direction of the spin.

Thus, a pure spin current without an accompanying current can be used as an information transmitting medium instead of an electron current in the case where detection of a spin current is possible, and the pure spin current does not generate Joule heat, and therefore, the power consumption for transmitting information can be reduced a great deal.

Though examples of the present invention are described in the above, the present invention is not limited to the configurations and conditions described in the Examples, and various types of modifications are possible.

For example, though Pt is used for the spin injection electrode in the above described examples, the material is not limited to Pt, and any conductor may be used. Though elements having an f orbit, like Pt or Au, are desirable from the point of view of efficiency, Pd, which has great spin orbit coupling, may be used.

Though the free layer is formed of NiFe and the pinned layer is formed of CoFe in the above described Examples 2 to 5, the material is not limited to these, and the free layer may be formed of CoFe and the pinned layer may of NiFe, or other ferromagnetic bodies, such as CoFeB, may be used, or a multilayer structure, such as of NiFe/CoFe, may be used.

Though IrMn is used for the antiferromagnetic layer in the above described Examples 2 to 5, other antiferromagnetic bodies, such as of PdPtMn, may be used.

In the case where PdPtMn is used, an orientation controlling film, such as of NiFe, is required for the base, and therefore, the free layer and the pinned layer are switched in position.

Furthermore, the free layer and the pinned layer may be switched in position irrespectively of the material for the antiferromagnetic layer, and in this case, it is necessary for the word line for write-in and the spin injection electrode to be provided on the free layer side.

Though an antiferromagnetic layer is used in order to fix the direction in which the pinned layer is magnetized in the above described Examples 2 to 5, the antiferromagnetic layer is not absolutely necessary. When the coercive force in the pinned layer is considerably greater than in the free layer, for example, it is possible to omit the antiferromagnetic layer.

Though the magnetic memory portion is formed so as to have a tunnel magneto-resistive element structure in the above described Examples 1 to 5, there are no limitations to the tunnel magneto-resistive element structure. For example, a spin valve film having a CPP structure may be formed using a paramagnetic conductive layer, such as of Cu, instead of an Al2O3 film or an MgO film.

Though the layers from the free layer to the antiferromagnetic layer are formed directly on top of each other when the magnetic memory portion is formed in the above described Examples 1 to 5, the free layer or the antiferromagnetic layer may be formed with a base film, such as of Ta, in between, and a cap layer, such as of Ta, may be provided on top, for example.

Though the lower electrode and the spin injection electrode are formed simultaneously of Pt in order to simplify the manufacturing process in the above described Examples 2 to 5, the lower electrode may be formed of a material having low efficiency in spin current conversion.

In addition, propositions have been made to provide a spin RAM into which a polarized spin current is injected with an assist line for applying an assist magnetic field in the direction in which it is difficult for the magneto-resistive effect element to be magnetized at the time of write-in (see Japanese Unexamined Patent Publication 2007-123637, for example). In this case also, a weak current may flow in such a direction as to accelerate spin relaxation before the precession of the magnetic moment in the free layer converges when information is written in, like in the above described Example 1.

Though the quantum bit is formed of a nuclear spin in an inclusion atom in the above described Example 6, the quantum bit is not limited to having this structure. For example, the spin state of a molecule may be used, as in the above described Non-Patent Document 1, and thus, the invention can be applied to any quantum operation apparatus using a solid.

Though the presence of a spin current is detected using reflection of a current that flows through the microstrip line in the above described Example 7, there is a difference in potential between the two ends of the magnetic material, due to the above described inverse spin-Hall effect, when a spin current is injected into the magnetic material, and therefore, the presence of a spin current may be detected by detecting the difference in potential.

INDUSTRIAL APPLICABILITY

Typical examples where the present invention are MRAM's, quantum computers and spin current detecting means using a spin current as an information transmitting medium, but the present invention can be applied to other types of spintronic devices of which the principle of operation is a spin relaxation phenomenon, and can also be applied for various types of spin current detecting means.

The invention claimed is:

1. A method for changing spin relaxation comprising:
    increasing or decreasing the spin relaxation time by injecting a pure spin current into a material in a spin state,
    wherein said the material forms a free layer in a magneto-resistive effect type random access memory comprising the free layer, an insulating layer and a pinned layer.

2. A method for changing spin relaxation comprising:
    increasing or decreasing the spin relaxation time by injecting a pure spin current into a material in a spin state,
    wherein the material forms a quantum bit that forms a solid-state quantum computer.

3. A method of detecting a pure spin current, comprising:
    applying microwaves having a frequency in the vicinity of the ferromagnetic resonance particular to a magnetic material;
    changing the pure spin relaxation time by injecting said spin current into said magnetic material where the magnetic moment is in precession; and
    detecting change in spin relaxation.

4. The spin current detecting method according to claim 3, wherein said microwaves are applied when a current in a microwave band flows through a microstrip line extending in the direction parallel to the direction in which said magnetic material is magnetized.

5. A spintronic device using a spin relaxation phenomenon, comprising:
    a magneto-resistive effect type random access memory comprising a free layer;
    a magnetic field generator for controlling the magnetization direction of the free layer; and
    a spin injection electrode contacting the free layer.

6. A spintronic device using a spin relaxation phenomenon, comprising:
    a magneto-resistive effect type random access memory comprising a free layer; and
    a spin injection electrode contacting the free layer,
    wherein the spin injection electrode magnetizes the free layer by pure spin injection.

7. The spintronic device using a spin relaxation phenomenon according to claim 5, wherein the spin injection electrode for injecting a pure spin current into said free layer is formed of a material in a region of a short mean free path just before metal-insulator transition occurs.

8. The spintronic device using a spin relaxation phenomenon according to claim 5, wherein the spin injection electrode for injecting a pure spin current into a free layer is formed of an amorphous layer.

9. The spintronic device using a spin relaxation phenomenon according to claim 7, wherein said spin injection electrode is made of Pt, Au, Pd or an element having an f orbital.

10. A spintronic device using a spin relaxation phenomenon, comprising:
    an electro-resistive effect type random access memory comprising a free layer, an insulating layer and a pinned layer; and
    a microstrip line extending in the direction parallel to the longitudinal direction of the free layer in the vicinity of the free layer.

11. A spintronic device using a spin relaxation phenomenon, comprising:
    a quantum bit forming a solid state quantum computer; and a spin injection electrode to make contact with the quantum bit.

12. A spintronic device using a spin relaxation phenomenon, comprising:
a spin current detecting portion made of a magnetic material of which the longitudinal direction is perpendicular to the direction in which said spin current transmitting wire extends to make contact with a portion of a spin current transmitting wire for transmitting information as a pure spin current, and
a microstrip line extending in the longitudinal direction of said spin current detecting portion.

13. The spintronic device using a spin relaxation phenomenon according to claim 6, wherein the spin injection electrode for injecting a pure spin current into said free layer is formed of a material in a region of a short mean free path just before metal-insulator transition occurs.

14. The spintronic device using a spin relaxation phenomenon according to claim 13, wherein said spin injection electrode is made of Pt, Au, Pd or an element having an f orbital.

15. The spintronic device using a spin relaxation phenomenon according to claim 6, wherein the spin injection electrode for injecting a pure spin current into a free layer is formed of an amorphous layer.

* * * * *